(12) United States Patent
Bedjaoui et al.

(10) Patent No.: US 10,763,468 B2
(45) Date of Patent: Sep. 1, 2020

(54) SEALING CELL AND METHOD FOR ENCAPSULATING A MICROELECTRONIC COMPONENT WITH SUCH A SEALING CELL

(71) Applicant: COMMISSARIAT À L'ÉNERGIE ATOMIQUE ET AUX ÉNERGIES ALTERNATIVES, Paris (FR)

(72) Inventors: Messaoud Bedjaoui, Voreppe (FR); Jean Brun, Champagnier (FR); Johnny Amiran, Eydoche (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 330 days.

(21) Appl. No.: 15/960,020

(22) Filed: Apr. 23, 2018

(65) Prior Publication Data

US 2018/0309097 A1 Oct. 25, 2018

(30) Foreign Application Priority Data

Apr. 25, 2017 (FR) ...................... 17 53597

(51) Int. Cl.
*H01M 2/08* (2006.01)
*H01M 10/052* (2010.01)
*H01M 2/04* (2006.01)
*H01M 2/06* (2006.01)
(Continued)

(52) U.S. Cl.
CPC ............. *H01M 2/08* (2013.01); *H01L 21/50* (2013.01); *H01L 23/10* (2013.01); *H01M 2/0404* (2013.01); *H01M 2/065* (2013.01); *H01M 10/052* (2013.01)

(58) Field of Classification Search
CPC ...... H01L 21/50; H01L 23/10; H01M 10/052; H01M 2/0404; H01M 2/065; H01M 2/08
See application file for complete search history.

(56) References Cited

U.S. PATENT DOCUMENTS

| 8,878,051 B2 | 11/2014 | Mader |
| 2003/0027371 A1 | 2/2003 | Sumagawa et al. |
| 2003/0111441 A1 | 6/2003 | Jerominek et al. |

(Continued)

FOREIGN PATENT DOCUMENTS

WO 2006045067 A1 4/2006

OTHER PUBLICATIONS

U.S. Appl. No. 15/901,983 entitled "Connection Between a Circular Shell and a Radial Structural Arm of a Turbomachine, Comprising a Seal and Its Support", filed Feb. 22, 2018.

*Primary Examiner* — Lingwen R Zeng
(74) *Attorney, Agent, or Firm* — Pearne & Gordon LLP

(57) ABSTRACT

Sealing cell for encapsulating a microelectronic component arranged on a substrate, with a cap, said sealing cell including: a bottom including a receiving zone for the substrate and a peripheral zone surrounding the receiving zone, a side wall formed of an internal face, an external face and an upper face, the upper face being configured to support the cap facing the receiving zone, an opening, arranged in the bottom of the cell, in the side wall, or in the cap, the opening being configured to be connected to a pumping system, in such a way as to be able to place under controlled atmosphere a cavity delimited by the side wall, the bottom and the cap.

14 Claims, 5 Drawing Sheets

(51) Int. Cl.
*H01L 21/50* (2006.01)
*H01L 23/10* (2006.01)

(56) References Cited

U.S. PATENT DOCUMENTS

| | | |
|---|---|---|
| 2006/0197215 A1 | 9/2006 | Potter |
| 2008/0164606 A1 | 7/2008 | Greisen et al. |
| 2011/0241060 A1 | 10/2011 | Liu et al. |
| 2012/0024375 A1* | 2/2012 | Mader .................. E06B 3/6775 |
| | | 136/259 |
| 2014/0111919 A1 | 4/2014 | Miyasaka et al. |
| 2015/0186568 A1 | 7/2015 | Anfriani et al. |
| 2016/0026256 A1 | 1/2016 | Massu et al. |
| 2016/0035592 A1* | 2/2016 | Mitani .................. H01L 21/565 |
| | | 438/127 |
| 2016/0356700 A1 | 12/2016 | Rouxel et al. |
| 2017/0241292 A1 | 8/2017 | Perez et al. |
| 2017/0373350 A1 | 12/2017 | Bedjaoui et al. |

\* cited by examiner

SEALING CELL AND METHOD FOR ENCAPSULATING A MICROELECTRONIC COMPONENT WITH SUCH A SEALING CELL

CROSS-REFERENCE TO RELATED APPLICATIONS

This application claims priority from French Patent Application No. 17 53597 filed on Apr. 25, 2017. The content of this application is incorporated herein by reference in its entirety.

TECHNICAL FIELD AND PRIOR ART

The present invention relates to a sealing cell for encapsulating microelectronic components to protect them from an external atmosphere, and notably air, and more particularly to a sealing cell for encapsulating air-sensitive microelectronic components.

The present invention also relates to an encapsulation method implementing the sealing cell.

Microelectronic components (of nanometric or micrometric dimensions), and more particularly, electrochemical devices such as entirely solid microbatteries made of thin layers, have become, for some years now, essential in the development of embedded intelligent systems. In the particular case of lithium microbatteries, the use of lithium containing materials in thin layers is very critical on account of their very great sensitivity to atmospheric elements such as oxygen and water vapour. These batteries thus need to be encapsulated to guarantee not just their electrochemical integrity but also their mechanical integrity over time.

Several methods exist for encapsulating microelectronic components. Nevertheless, the melting temperature of lithium (around 180° C.) and the size of the components restrict the choice of the possibilities. For example, methods for encapsulating components by lamination are not suited to high density microbatteries (increase in the active surface compared to the surface of the packaging).

One of the key technologies for the encapsulation of microbatteries calls on techniques of transferring thin (thickness of 100 µm to 500 µm), or ultrathin (thickness less than 100 µm) caps, onto host substrates containing the components to encapsulate. The integration of these caps is achieved by means of sealing beads, arranged around the microbatteries, and which are sealed both to the substrate and to the cap.

It is, for example, possible to seal a cap on a host substrate by thermocompression. This technique consists in exerting a homogenous pressure between the substrate and the cap and heating the whole substrate to make the sealing beads melt and to vitrify them. However, this method is inapplicable in the case of temperature sensitive microelectronic components because the heating temperature can reach several hundreds of degrees depending on the paste used.

One of the most promising techniques is encapsulation by laser sealing: the sealing beads are heated locally by irradiation, which limits the risks of degradation of the lithium containing layers. This technique is, particularly, suited for devices of small dimensions. Conventionally, as represented in FIG. 1, the method consists in forming a microbattery 1 on a substrate, made of glass. The microbattery includes a stack of active layers 3 and current collectors 4. The sealing beads 5, made of glass paste, are formed on the face of the cap 6 intended to be facing the microbattery. The cap 6 is transferred onto the substrate 2, the sealing beads 4 being positioned at the level of the current collectors 4 of the microbattery 1. Each microbattery 1 is surrounded by a bead to ensure lateral leak tightness. A mechanical force (represented by the arrows F in FIG. 1) is applied vertically over the entire surface of the cap 6 in order to reduce the space between the cap 6 and the substrate 2, and to ensure that the bead 5 is in contact both with the cap 6 and the substrate 2. Once the cap 6 and the substrate 2 are positioned, the beads 5 are heated by laser irradiation in order to be vitrified. In the documents US2011/0241060A1 and WO2006/045067A1, this encapsulation method is used, for example, to encapsulate microelectronic components, such as OLEDs (Organic Light Emitting Diodes).

However, planeness defects can occur when the bead 5 melts locally under the effect of irradiation. As represented in FIG. 1, during the encapsulation method, the bead 5 made of glass paste melts as the passage of the laser beam (represented by the arrows L) progresses. The part of the bead that has melted has a thickness less than that of the non-melted part, which generates a planeness defect. The space between the cap 6 and the host substrate 2 increases locally, leading to a disbondment of a part of the bead 5 either from the substrate 2 or from the cap 6. Yet, a leak tight and robust weld requires perfect placing in contact. The application of mechanical force on the whole of the cap 6 does not make it possible to compensate this planeness defect. This phenomenon is preponderant for caps 6 having large surfaces, thereby reducing the industrial and technological benefit of this encapsulation method.

DESCRIPTION OF THE INVENTION

It is, consequently, an aim of the present invention to propose a device making it possible to encapsulate microelectronic components efficiently. It is also an aim of the present invention to propose an encapsulation method that overcomes the drawbacks of the prior art and, in particular, to propose a method for encapsulating microelectronic components sensitive to air and/or to high temperatures (greater than or equal to 180° C.) making it possible to form leak tight and mechanically solid welds.

These aims are attained by a sealing cell for encapsulating a microelectronic component, arranged on a substrate, with a cap, said sealing cell including:
- a bottom including a receiving zone for the substrate and a peripheral zone surrounding the receiving zone,
- a side wall formed of an internal face, an external face and an upper face, the upper face being configured to support the cap facing the receiving zone,
- an opening, arranged in the bottom of the cell, in the side wall, or in the cap, the opening being configured to be connected to a pumping system, in such a way as to be able to place under controlled atmosphere a cavity delimited by the side wall, the bottom and the cap.

The invention proposes an encapsulation device that can be placed under controlled atmosphere, and notably under vacuum, and compatible with methods for laser sealing thin and ultrathin substrates/caps. Placed under vacuum is taken to mean that the device is taken to a pressure less than ambient pressure, which is around 1013.25 hPa.

The device makes it possible to encapsulate microelectronic devices arranged on a substrate efficiently with a thin or ultrathin cap.

Thin is taken to mean a thickness of 100 µm to 500 µm and ultrathin is taken mean a thickness less than 100 µm.

Advantageously, the receiving zone is raised with respect to the peripheral zone, which makes it possible to displace the substrate to encapsulate laterally, in order to position it perfectly with respect to the cap.

Advantageously, the side wall goes beyond the receiving zone by a thickness greater than the thickness of the substrate with the microelectronic component, for example at least 50 µm, and preferably at least 100 µm. The side wall goes beyond, upwards, the receiving zone in order to be able to maximise, during the placing under vacuum of the sealing cell, the bearing force on the sealing bead that surrounds the microelectronic component to encapsulate.

Advantageously, a bevelled edge is arranged between the upper face and the internal face of the side wall. This will facilitate deformation of the cap when the sealing cell is placed under vacuum, avoiding the creation of mechanical stresses, and embrittlement of the cap, especially for a cap of low thickness, that there would be with a protruding edge.

Advantageously, the upper face of the side wall has a groove, in which is inserted a seal. The leak tightness of the sealing cell is thereby improved.

Advantageously, the side wall is circular, in order to spread out better the mechanical stresses on the cap when it is placed under vacuum. Those skilled in the art may select any other wall geometry providing it is adapted to the shape of the cap.

Advantageously, the sealing cell is made of stainless steel, glass, ceramic, silicon, quartz, copper, aluminium or one of the mixtures thereof. Such materials have sufficient leak tightness properties to be able to implement the method.

Advantageously, the receiving zone includes a hollowing out, in such a way as to form a housing for the substrate. The substrate will be stabilised during the encapsulation method.

This aim is also attained by a method for encapsulating a microelectronic component arranged on a substrate including at least the following successive steps:

a) supplying a sealing cell as defined previously,
b) depositing a sealing bead, on the substrate and/or on the face of the cap intended to be facing the substrate,
c) positioning the substrate provided with the microelectronic component to encapsulate on the receiving zone of the sealing cell, and positioning the cap on the upper face of the sealing cell,
d) placing under controlled atmosphere the cavity formed by the cap and the sealing cell, via the opening, in such a way as to make the cap bend towards the substrate, until the sealing bead is placed in contact both with the substrate and with the cap,
e) localised heating of the sealing bead, in such a way as to seal the cap to the substrate.

The encapsulation method of the present invention exploits the mechanical properties of encapsulation caps, advantageously of low thicknesses, in order to be free of the limitations of the prior art. Thus, the bending of the closing cap, under the effect of placing under vacuum, or more generally under controlled atmosphere, of the proposed enclosure, enables a very homogeneous distribution of bearing force at the level of the sealing beads, which contributes to the increase in the contact surface between the beads and the substrate/cap by deformation. This approach optimises the size of the sealing zone while minimising the surface of the sealing bead on the host substrate while increasing the contact surface necessary for the welding of the beads.

The increase in temperature, during the localised heating, makes the materials of the beads more easily deformable by fusion effect, which also increases the contact surface.

Advantageously, the cap has a thickness and a Young's modulus that confer on it mechanical properties allowing it to bend during step d), and notably a thickness less than or equal to 500 µm and a Young's modulus less than or equal to 100 GPa.

Advantageously, the sealing bead is a fusible material selected, notably, from a glass paste and a metal material.

Glass paste is taken to mean an organic binder in which is dispersed a glass powder. Metal material is taken to mean a metal or a metal alloy.

Advantageously, the sealing bead is heated by laser irradiation, through the cap, the cap being transparent to the laser wavelength. The input of heat takes place locally thanks to the heat flux resulting from the laser on the sealing bead. Only the zone of interest is heated, which preserves the microelectronic component from heat and avoids damaging it.

Advantageously, during step d) and/or step e), a mechanical force is exerted on the cap to accentuate the bending of the cap towards the substrate. The mechanical force completes the force exerted by the deformation of the cap, the contact surface between the cap and/or the substrate is increased, which leads to welds that are more stable mechanically.

Advantageously, the mechanical force is produced with a mechanical stylet. It is thereby possible to apply a maintaining force uniquely at the level of the weld while it is being formed.

Advantageously, the mechanical stylet is equipped with a laser source with, optionally, a means of focusing said laser beam. The stylet provided with the laser source makes it possible to have a specific bearing on the bead and to heat it locally by focusing, potentially, the beam.

Advantageously, the cap and/or the substrate, provided with the sealing bead, is pre-heated, before step c), in such a way as to degas at least partially the volatile products present in the bead before sealing. The products stemming from degassing will thereby not be trapped between the substrate and the cap after encapsulation, and will not be able to damage the active layers of the microelectronic component.

Advantageously, the cap comprises, moreover, a microelectronic component identical or different to that of the substrate. It is possible to carry out a 3D integration.

Advantageously, the values of the thermal expansion coefficients of the cap, the substrate and the sealing bead vary by at the most 10% from each other, in order to avoid the creation of inhomogeneous mechanical stresses between the different elements of the assembly, which could lead to their embrittlement during laser heating.

Advantageously, the cap and/or the substrate and/or the sealing bead are made of glass in order to limit as much as possible mechanical stresses during assembly. Made of glass is taken to mean actually made of glass or based on glass, that is to say that these elements are mainly formed of glass. For example, they include more than 50% by weight, preferably more than 70% by weight, of glass.

Advantageously, the cap and/or the substrate has a thickness less than 100 µm. The method makes it possible to transfer caps of small thicknesses, which is beneficial to miniaturisation. The method benefits, at the same time, from this sought-after low thickness, since caps of low thickness will be more flexible and will have a greater deformation when the sealing cell is placed under vacuum, increasing the contact surface between the elements to weld and the sealing bead.

Advantageously, the microelectronic component is an electrochemical device, notably a solid microbattery, for example a lithium microbattery.

According to another aspect, one embodiment provides a device for the implementation of an encapsulation method as defined previously.

BRIEF DESCRIPTION OF THE DRAWINGS

The present invention will be better understood on the basis of the description that follows and the appended drawings, in which.

The different parts represented in the figures are not necessarily according to a uniform scale, in order to make the figures more legible.

The different possibilities (alternatives and embodiments) should be understood as not being mutually exclusive and can be combined together.

DETAILED DESCRIPTION OF PARTICULAR EMBODIMENTS

Figure 2:
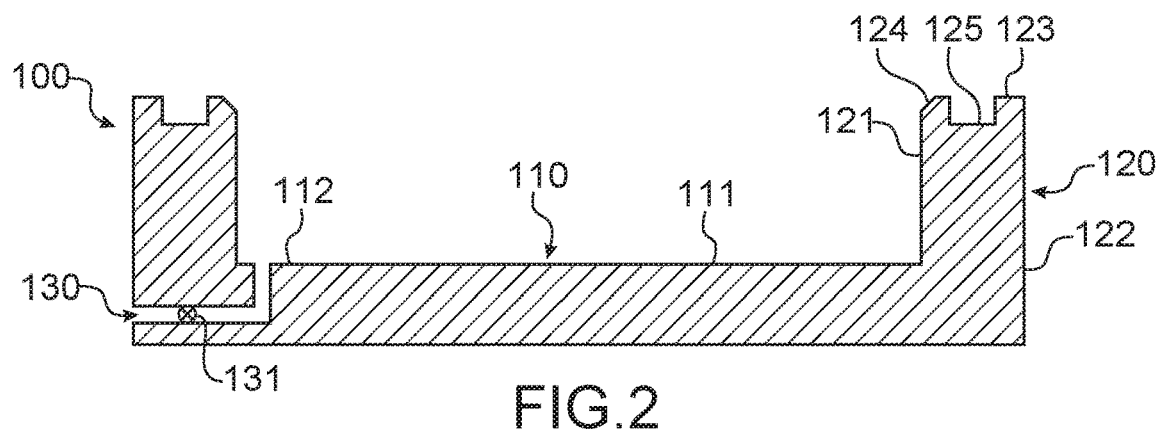
FIG. 2 is a schematic representation, in section and in profile, of a sealing cell according to a first embodiment of the invention.

Sealing Cell:

In FIGS. 2 and 3 may be seen schematic representations of a sealing cell 100, also called substrate holder or instead sealing and encapsulation cell, according to different embodiments of the invention. The sealing cell 100 makes it possible to encapsulate easily and efficiently an air-sensitive microelectronic component, arranged on a substrate, with a cap.

The sealing cell 100 includes a bottom 110 composed of two zones: a central zone 111, designated receiving zone, on which will be positioned the substrate, provided with the component or components to encapsulate, and a peripheral zone 112. The peripheral zone 112 surrounds the central zone 111. The bottom 110 may be circular, square, rectangular or any other geometric shape. Advantageously, the bottom 110 is circular and the peripheral zone 112 forms a circular ring around the central zone 111, also circular.

In FIG. 2, the bottom 110 is flat: the central zone 111 and the peripheral zone 112 are at the same level. According to an alternative represented in FIG. 3A, the central zone 111 has extra thickness compared to the peripheral zone 112, that is to say that it is raised with respect to the peripheral zone 112, that it goes beyond the peripheral zone 112. This, as will be seen hereafter, makes it possible to position in a suitable manner the substrate with respect to the cap. The height will be, advantageously, selected as a function of the thickness of the substrate, the cap and the component to encapsulate.

Figure 3A:
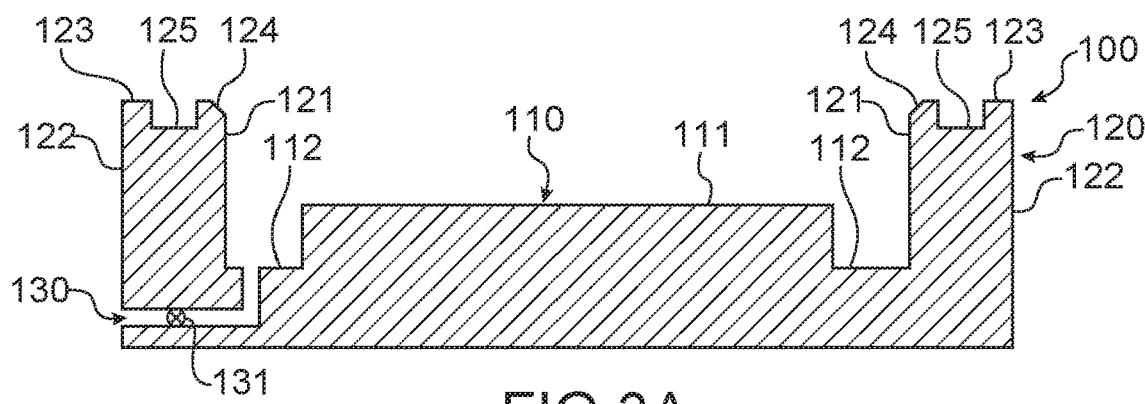
FIG. 3A is a schematic representation, in section and in profile, of a sealing cell according to a second embodiment of the invention.
Figure 3B:
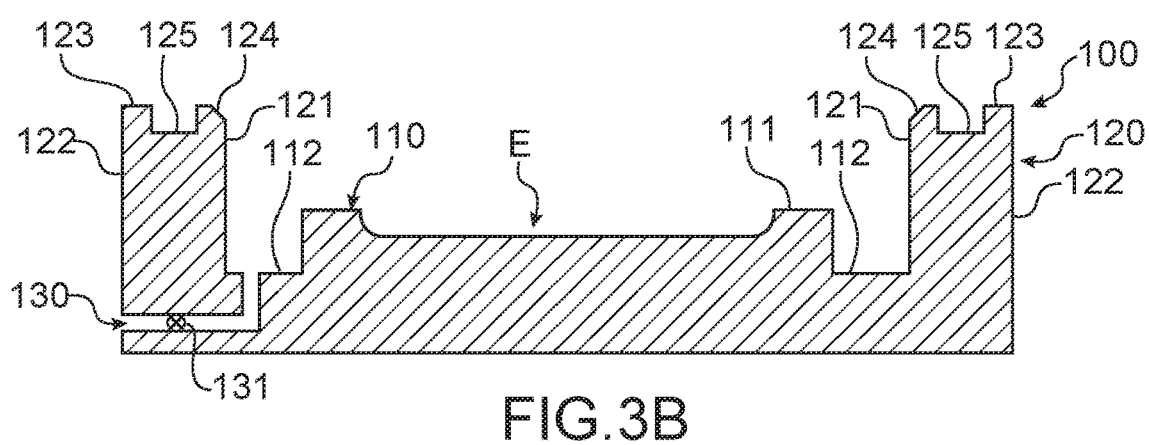
FIG. 3B is a schematic representation, in section and in profile, of a sealing cell according to a third embodiment of the invention.

The receiving zone 111 may be hollowed out locally in such a way as to form a housing for the substrate in order to improve its stability during the encapsulation method (hollowing out E in FIG. 3B). Hollowing out is taken to mean forming a hollow, a non-through hole.

The sealing cell 100 also comprises a side wall 120. The side wall 120 is formed of an internal face 121, an external face 122 and an upper face 123. The face 121 and the external face 122 are, preferably, parallel with each other. The upper face 123 is, preferably, perpendicular to the internal 121 and external 122 faces. The upper face 123 is configured to support the cap.

Advantageously, a bevelled edge 124 is arranged between the upper face 123 and the internal face 121. Bevelled edge is taken to mean a small flat surface formed by a cut-down edge. The bevelled edge 124 forms a chamfer, to give greater flexibility, as will be seen hereafter, to the cap in its deformation movement. As represented in FIGS. 2 and 3, the bevel angle $\alpha$ is less than 90°. Preferably, it ranges from 10° to 80°, more preferentially 25° to 65°, and even more preferentially, it is of the order of 45°.

Advantageously, the upper face 123 has a groove 125, or gorge, configured to position a seal (not represented in FIGS. 2 and 3). The seal improves the leak tightness between the sealing cell 100 and the cap.

The side wall 120 is, advantageously, circular and the seal is an O-ring, that is to say in the form of a circular ring of round section. For example, a seal will be selected with a standard Shore A hardness of 60 to 90. It is, for example, manufactured from elastomeric plastic materials such as butadiene-acrylonitrile (also called nitrile, also known under the name NBR for "nitrile butadiene rubber"), ethylene propylene copolymers or a fluoropolymer such as fluorocarbon (or poly(vinylidene fluoride) (PVDF)), or Viton®. The selection of the O-ring is linked to the dimensions of the gorge (width D and depth G).

The sealing cell 100 also comprises an opening 130, arranged in the peripheral zone 112 (as represented in FIGS. 2 and 3), to place under vacuum the cavity delimited by the side wall 120, the bottom 110 and the cap which will be positioned on the side wall 120.

According to an alternative, not represented, the opening 130 may also be in the side wall 120.

The opening 130 forms a conduit in which may be arranged a regulation system 131, such as for example a valve.

The opening 130 may be connected to a pump, or to any suction system making it possible to place the enclosure under vacuum.

The sealing cell 100 is, advantageously, one-piece, that is to say formed from a single part, in order to improve its leak tightness.

According to an alternative, the elements of the sealing cell, and notably the central zone 111 and the peripheral zone 112, may be machined separately then assembled by fastening or bonding for example.

The sealing cell 100 is made from a material which is able to guarantee sufficient leak tightness properties to the sealing cell vis-à-vis air and water vapour. The selected material will have a water vapour transmission rate (WVTR) or oxygen transmission rate (OTR) sufficiently low to be considered as leak tight to water vapour and to diatomic oxygen. Leak tight is taken to mean WVTR values of at the most $10^{-4}$ $g.m^{-2}.j^{-1}$ and OTR values of at least $10^{-4}$ $cm^{-3}.m^{-2}.j^{-1}$.

The sealing cell is, for example, made of stainless steel. However, it could be elaborated from another material. As an illustration, aluminium, copper, silicon, ceramic, glass, or instead quartz may be cited. It may also be a mixture of these materials.

As an illustration, the geometric dimensions of the sealing cell are, for example, while referring to FIGS. 3A and 3B: R=150 mm, R1=25 mm, R2=30 mm, R3=40 mm, H=20 mm. Advantageously, the side wall 120 goes beyond the receiving zone by at least 50 µm, and preferably at least 100 µm (height H1 in FIGS. 2, 3A and 3B) to be able to position the substrate provided with the microelectronic component on the receiving zone. At the same time it will be sought to minimise this height H1 in order to maximise the bearing force on the sealing beads.

The cavity of the sealing cell 100 may be obtained by hollowing out a bulk material by any technique for removing material. It may be a thermal method (use of electron beams, plasma or laser, for example), a chemical method (chemical dissolution, electrochemical machining), a mechanical method (liquid jet with abrasive, ultrasounds) or instead any technique of machining using cutting tools (turning, milling, drilling, reaming, threading, etc.). As an illustration, the sealing cell is machined from a single block of material thanks to a technique of milling using tungsten carbide heads.

Generally speaking, those skilled in the art will be able to configure the sealing cell according to several architectures and dimensions providing they satisfy the required functionalities (leak tightness, placing under vacuum, etc.).

From an industrial viewpoint, the sealing cell 100 is a tool that is easy to use for carrying out the encapsulation steps, that is to say for transferring a cap 400 onto a substrate 200.

Encapsulation Method:

The method for encapsulating microelectronic components sensitive to air (diatomic oxygen and water vapour), and/or high temperatures (above 180° C.), implementing such a sealing cell, will now be described with reference to FIGS. 5A to 5F.

Microelectronic Component 300 to Encapsulate:

The method makes it possible to encapsulate simultaneously one or more microelectronic components arranged on a substrate or on several substrates. The substrate is also called host substrate. The electronic component has a thickness ranging from 5 µm to 30 µm, and preferably from 10 to 15 µm. It may have a surface area of several square centimetres, for example it may have a surface area of around 2.5 cm×2.5 cm.

Microelectronic component is taken to mean, for example, a MEMS (microelectromechanical system), a MOEMS (micro opto-electro-mechanical system), or an infrared micro-detector, or even a transistor. More generally, microelectronic component is taken to mean any device intended to be encapsulated under controlled atmosphere.

Hereafter, even if the description makes reference to a microbattery, and more particularly a solid microbattery, for example a lithium microbattery, the invention is transposable to any microelectronic component requiring protection vis-à-vis oxidants and/or sensitive to high temperatures (greater than 180° C.). It may be, for example, a capacitive stack or an electrochemical component.

Figure 4:
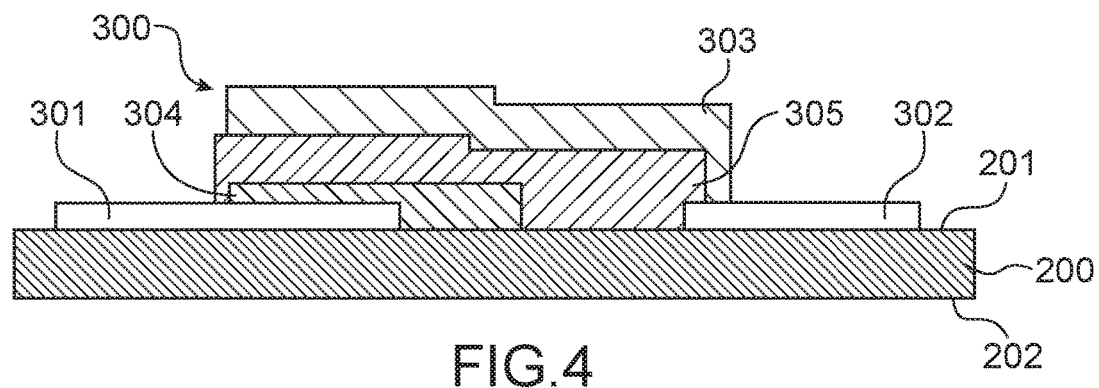
FIG. 4 is a schematic representation, in section and in profile, of a microbattery arranged on a substrate, according to a particular embodiment of the invention.

As represented in FIG. 4, the substrate 200 comprises two main faces 201, 202. The microelectronic component 300, here the microbattery, is arranged on one of the faces 201 of the substrate 200. The microbattery includes cathodic 301 and anodic 302 current collectors, arranged on the substrate 200. Two active layers, one forming the negative electrode 303, and the other forming the positive electrode 304, are separated by a layer of electrolyte 305. Each active layer 303, 304 is in contact with one of the current collectors 301, 302.

The current collectors 301, 302 are, advantageously, metal. As an indication, they may be made of titanium, gold, aluminium, platinum, or tungsten.

The substrate 200 has, advantageously, the performances required for the encapsulation of lithium microbatteries. It is elaborated from a material having WVTR and OTR barrier levels of at the most, respectively, $10^{-4}$ g/m²/j and $10^{-4}$ cm³/m²/j.

The substrate 200 is, for example, made of glass, ceramic, mica, silicon, or quartz. Preferably, it is made of glass. It is for example a glass of D263T type sold by the SCHOTT® Company. The substrate may be thin (thickness of 100 µm to 500 µm) or ultrathin (thickness less than 100 µm). The thin substrate has, for example, a thickness of the order of 50 µm.

The positive electrode 304 (cathode) is made of a material having good electron and ion conductivity (for example TiOS, $TiS_2$, LiTiOS, $LiTiS_2$, $LiCoO_2$, $V_2O_5$, etc.). The electrolyte 305 is an electron insulator with high ion conductivity (for example LiPON, LiPONB, LiSiCON, etc.). The negative electrode 303 (anode) is a layer which may be metal lithium or a lithium containing material.

The microbattery will be produced by techniques known to those skilled in the art.

Advantageously, several microbatteries arranged on a same substrate are encapsulated simultaneously. In FIG. 5A and FIGS. 5B, 5C, 5D, 5E and 5F, only two microbatteries 300, on a same substrate 200, are represented for greater legibility. For the method, more than two batteries could be encapsulated simultaneously. To make the figures easier to understand, the assembly formed by the active layers and the electrolyte is represented in the form of a block 310. The current collectors 301 and 302 are also represented.

Encapsulation Cap 400:

The microbattery 300 will be encapsulated with a cap 400, also called sealing lid or encapsulation and sealing lid. The shapes and the geometric dimensions and the nature of the materials of the cap 400 may be different to that of the host substrate. The cap 400 is, advantageously, transparent to the laser wavelength.

Transparent is taken to mean that the cap allows at least 50% of the light emitted by the laser to pass through in such a way as to be able to heat the sealing bead through the cap 400.

The cap 400 is leak tight vis-à-vis oxidants in air. The cap 400 has, advantageously, WVTR and OTR barrier levels, respectively, of $10^{-4}$ g/m²/j and $10^{-4}$ cm³/m²h at least.

The material of the cap 400 is also selected in such a way as to be able to support bending stresses. It is generally selected from the family of materials having mechanical properties of flexibility enabling sufficient compressions under the effect of a low pressure (Young's modulus less than or equal to 100 GPa). It also has a low thickness (less than or equal to 500 µm) in order to be able to be bent. The cap may also be sufficiently rigid to prevent it remaining folded or bent once the assembly by compression is finished. The cap may in particular be selected from a family of materials having a Young's modulus greater than or equal to 20 GPa.

The cap 400 considered preferably has low bendability in other words low fracture toughness. By definition, toughness (the opposite to fragility) is defined as being the capacity to resist the propagation of a fissure and is measured in MPa.m$^{1/2}$. For the materials of the cap 400 (and the substrate 200), the toughness is generally below 20 MPa.m$^{1/2}$ and preferentially 10 MPa.m$^{1/2}$. For example the glass has a toughness of the order of 0.7 MPa.m$^{1/2}$.

Advantageously, to avoid having a material that expands more than the others under the effect of heat, and thus to avoid inducing mechanical stresses in the assembly, materials having thermal expansion coefficient (CTE) values as close as possible to each other will be used for the cap 400 and for the substrate 200. As close as possible is taken to mean that these values will vary from 0 and 10%.

Advantageously, to reduce mechanical stresses during assembly, materials having Young's modulus values as close as possible to each other will be used for the cap 400 and for the substrate 200. As close as possible is taken to mean that these values will vary from 0 and 10%.

In a preferred manner, the closing and sealing cap and the host substrate are selected from the different families of glasses (borosilicates or derivatives thereof, such as Borofloat® sold by Schott). By way of indication and in no way limiting, the products sold by Schott or Corning under the references AF45, D263®T, AF32®, Corning®Willow EAGLE XG®, or AS87 may be cited. The cap will have, advantageously, a thickness less than or equal to 500 µm, and preferably less than 100 µm and a Young's modulus less than or equal to 100 GPa, and preferably less than 75 GPa.

According to an alternative, they could be made of silicon or made of ceramic, ceramic having a toughness of the order of 7 MPa.m$^{1/2}$.

Figure 5A:
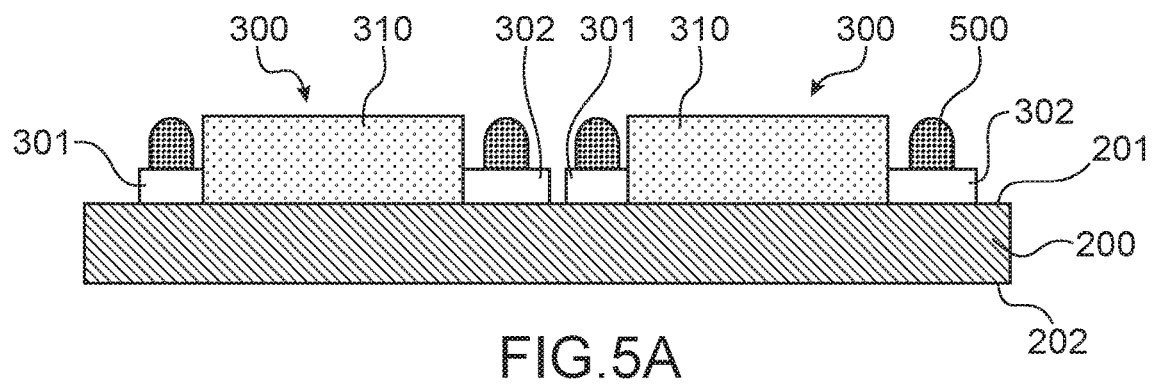
FIGS. 5A to 5G represent the different steps of an exemplary method for encapsulating microelectronic components, according to the invention.
Figure 5B:
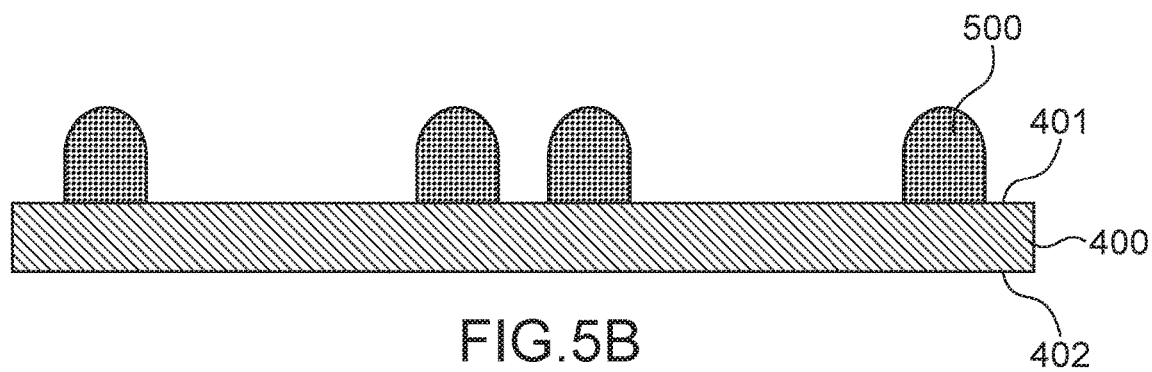

As represented in FIG. 5B, the cap 400 includes two main faces 401, 402. On one of its main faces 401 may be arranged electronic components, identical or different to those of the host substrate. This configuration offers the possibility of producing functional stacks by 3D integration.

Positioning the Sealing Bead 500:

A sealing bead 500 may be positioned on the substrate 200 (FIG. 5A), on the face 201 of the substrate which is covered by the electronic component 300 to encapsulate.

According to an alternative represented in FIG. 5B, the sealing bead 500 is positioned on the face 401 of the cap 400 intended to face the substrate 200, to be opposite the substrate 200 (FIG. 5B). If the cap includes microelectronic components, the bead will be deposited on this same face.

According to another alternative, not represented, one bead 500 could be positioned on the cap 400 and another on the substrate 200.

A bead may be used to encapsulate several batteries. Advantageously, each microbattery is surrounded by a sealing bead 500.

Figure 5C:
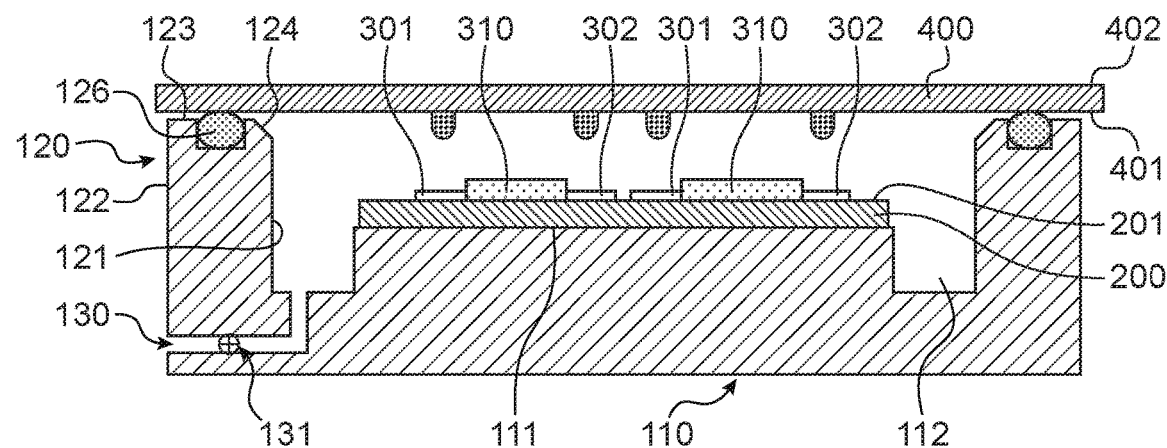

As represented in FIG. 5C, the sealing beads 500 are positioned in such a way that once the cap 400 is transferred onto the substrate 200, the beads 500 surround the microbatteries 300 to encapsulate in order to isolate them from the atmosphere. In the case of microbatteries 300, as represented in FIGS. 5A and 5C, the bead 500 is, advantageously, arranged at the level of the current collectors 301, 302 in order to gain space and facilitate miniaturisation.

The sealing bead 500 has a thickness that can vary from several microns to a hundred or so microns. Thickness is taken to mean the dimension perpendicular to the substrate/cap stack. Its thickness will be selected by those skilled in the art in order to create, once the encapsulation method is completed, a sufficient cavity between the substrate 200 and the encapsulation cap 400 so as not to perturb the charge and discharge cycles of the microbatteries. These cycles, which corresponds to a phenomenon of insertion/de-insertion of lithium between the two electrodes, generally result in volume expansion phenomena of the electrodes. It is thus vital to form a cavity that is sufficiently high for free vertical movement of the electrodes. The height of such a cavity depends on the height difference between the thickness of the bead 500 and that of the stack of active layers 310 of the battery 300. Typically, the minimum value of this height is set at around 5% of the value of the total thickness of the microbattery 300. The width and the thickness of the sealing bead 500 are optimised as a function of the size of the elements to protect in order to reduce efficiently the bulk of the surface of the beads 500 compared to the total surface of the microbattery device. The width of the sealing bead 500 will be at least 100 µm, in the case of a substrate 200 with microbatteries 300. Such dimensions meet the required leak tightness and mechanical strength properties. For example, a thickness of 50 µm and a width of 100 µm will be used. The thickness will be reduced during the localised heating. At the end of the encapsulation step the thickness will, advantageously, be reduced down to a thickness of 20 to 25 µm, for a width of around 100 µm. For example, a bead of glass paste of a thickness of 50 µm may be reduced by 10% to 30% by thermal heating effect according to the nature of the glass paste used.

The sealing bead 500 is made of a fusible material.

The sealing bead 500 may be metallic, for example, to form sacrificial metal layers.

Preferably, the bead is electrically non-conductive. It is made, preferably, from a glass paste. Glass pastes include glass particles dispersed in an organic binder. For example, a glass paste may contain at least 70% by weight of particles of $SiO_2$. The organic binder is destroyed on heating the glass paste. Glass pastes may be vitrified at temperatures ranging from 300° C. to 400° C. The vitrified glass pastes form the welds. They mechanically maintain the cap 400 on the substrate 200. They are also leak tight vis-à-vis oxidants in air.

As an example, the glass pastes sold by Namics under the reference DM2700P/H848, sold by AGC (Asahi Glass Company) under the references 4290D1, 5115HT1, TNS062-Z27-TP12, 5290D1 or instead sold by Corning under the reference Vita™ may be envisaged for the production of the sealing bead 500. These glass pastes are compatible with the glass materials selected for the substrate 200 and/or for the closing and encapsulation cap 400.

Advantageously, the cap 400, the substrate 200 and the sealing bead 500 are selected from the same family of materials, to have CET and/or Young's modulus values as close as possible and to avoid the creation of inhomogeneous mechanical stresses in the different materials which can lead to their embrittlement during laser heating. Preferably, the cap 400, the substrate 200 and the bead 500 are made of glass or based on glass.

Preferably, the bead 500 is elaborated from the paste DM2700P/H848. In addition to its intrinsic barrier properties vis-à-vis oxidising species (WVTR and OTR values of the order of $10^{-6}$ gm$^{-2}$j$^{-1}$ and $10^{-6}$ cm$^3$m$^{-2}$j$^{-1}$), this product has good thermal properties (CET of $7.7 \times 10^{-6}$ K$^{-1}$ at 20° C.) very similar to materials made of glass (CET of $7.2 \times 10^{-6}$ K$^{-1}$ at 20° C.). Moreover, this product may be sealed with relatively short times under laser irradiation (of the order of 60 seconds), which limits the risks of propagation of heat during the sealing step.

Alternatively, other products sold by AGC under the reference 5115HT1 or by Corning under the reference Vita™ may be used in the production of the sealing bead 500.

The bead 500 may be formed on the substrate 200 and/or on the cap 400 by depositing the fusible material locally by any suitable technique (by dispensing, for example by means of a calibrated syringe, by screen printing or others). The sealing bead may also be obtained by depositing the fusible material then by etching it according to the desired pattern.

After the step of depositing the glass paste, the sealing bead 500 obtained is, advantageously, subjected to a heat treatment (pre-heating) to dry, evaporate the solvents. The temperature of said treatment is, for example, from 100° C. to 160° C., for example of the order of 150° C. The duration of said treatment ranges, for example, from several minutes to one hour, for example of the order of 30 minutes. Said heat treatment makes it possible, advantageously, to degas at least partially the volatile products present in the sealing bead. For example, for a glass paste, they may be organic products (10 to 15% by volume).

Preferably, the sealing bead 500 is positioned on the cap 400 (FIG. 5B), in order to be able to carry out annealing without risk of altering the temperature sensitive microelectronic components of the substrate 200. Temperatures greater than 160° C. may be used, in this embodiment.

Positioning the Substrate 200 and the Cap 400:

In order to carry out the encapsulation, as represented in FIG. 5C, the substrate 200 is arranged on the receiving zone 111 of the sealing cell 100 and the cap 400, provided with a sealing bead 500, rests on the side wall 120 of the sealing cell 100, and, advantageously, on the seal 126 of the upper face 123. The side wall 120 serves as support for the cap 400. The sealing beads 500 face the current collectors 301, 302 of the microbatteries 300. The positioning of the different elements is carried out in such a way as to have the active layers 310 of the microbatteries 300 surrounded by the sealing beads 500. The position of the microbatteries 300 may be adjusted vertically and laterally thanks to a raised receiving zone 111

Placing the Sealing Cell 100 Under Vacuum:

The cavity formed by the bottom 110 and the side wall 120 of the sealing cell 100 and by the cap 400 is placed under vacuum. The cap 400 also plays, in addition to its role of final encapsulation of the microbattery 300, the role of valve for closing the sealing cell 100. The cap 400 has an upper surface on the surface delimited by the side wall, in such a way as to be able to close the cavity of the sealing cell 100.

The placing under vacuum is carried out through the opening 130, or passage. The valve 131 of the opening 130 is open during the placing under vacuum.

Placing under vacuum is taken to mean that the pressure is below atmospheric pressure (around 1013.25 hPa). For example, the placing under vacuum is carried out by placing the enclosure at a pressure less than $10^5$ Pa, and preferably, by placing the enclosure at a pressure ranging from 1 kPa to 3 kPa.

Placing the enclosure 100 under vacuum leads to a deformation of the cap 400 until the sealing beads 500 are placed in contact both with the cap 400 and the substrate 200. Placing in contact with the substrate is taken to mean that the sealing bead 500 is going to touch the substrate 200 or the element of the substrate on which it has to be sealed in such a way as to fasten the cap 400 to the substrate 200 after vitrification of the bead 500. For example, in the case of microbatteries 300, the bead 500 is in contact with current collectors 301, 302 arranged on and integral with the substrate 200). Each microbattery 300 is then arranged in local cavities delimited by the cap 400, the substrate 200 and the sealing beads 500.

Figure 5D:
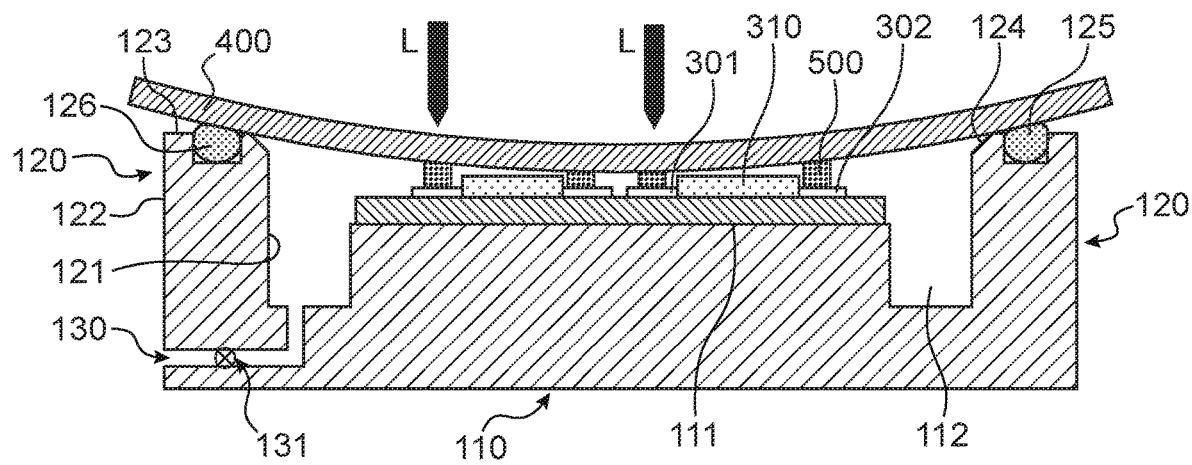

As represented in FIG. 5D, when the cavity is under vacuum, the cap 400 is deformed. The deformation results from the pressure difference between the inside of the cavity and the outside of the cavity.

The flexibility of the cap 400 is an essential parameter for optimising buckling phenomena during laser sealing operations. The trajectory of the deformation of the cap 400 is linked to the nature and to the thickness of the material of the cap 400, but also to the geometric shape of the sealing cell 100 and, more particularly, that of the side wall 120 which supports it.

Advantageously, a side wall 120 with a bevelled edge 124 is used (preferably with an angle of inclination a, oriented towards the inside of the cell, less than 90°, and preferably of the order of 45°) to facilitate the deformation of the cap 400 and thereby improve the flattening of the cap 400 facing the sealing beads 500.

The minimisation of the distance H1 between the first receiving zone 111 and the cap 400 also makes it possible to maximise the bearing force on the sealing beads 500. Advantageously, a receiving zone 111 will be used which is raised with respect to the peripheral zone 112 of the bottom 110 of the sealing cell 100.

The different parameters will be selected in such a way as to have a deformation of the cap 400 such that the contact surface between the sealing bead 500 and the substrate 200 (or the cap 400, depending on the element on which has been deposited the sealing bead 500) is greater than or equal to 80% of the total surface of the bead 500.

Figure 6:
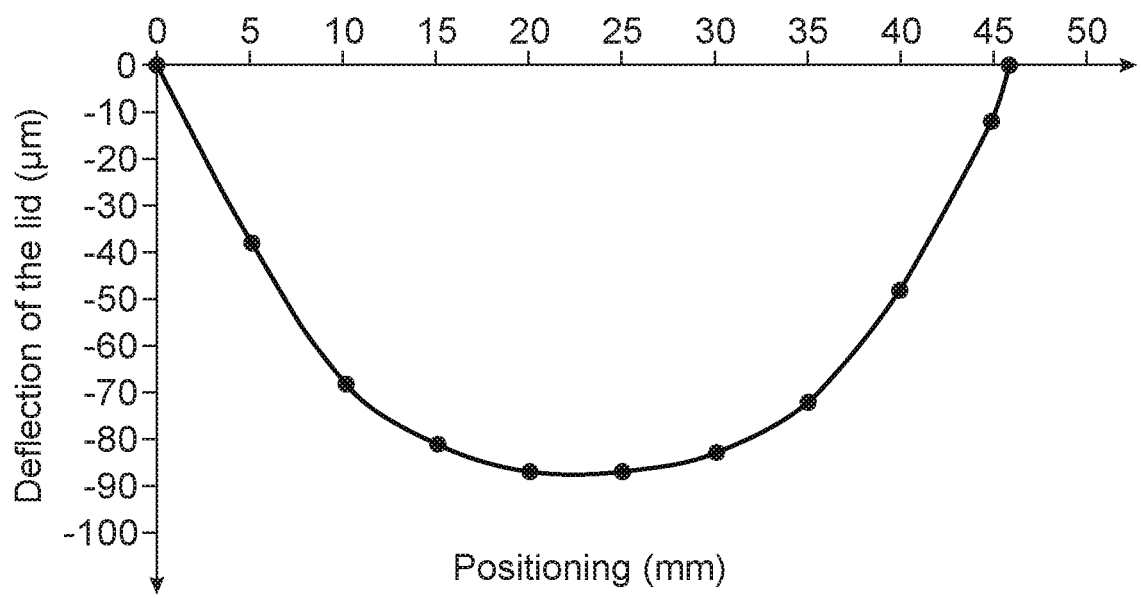
FIG. 6 is a graph showing the deformation of a cap when the sealing cell is placed under vacuum.

FIG. 6 is a graphical representation of the trajectory of a cap 400 made of glass D263T subjected to a deformation caused by placing the enclosure under a vacuum of between 1 and 3 kPa. In the example, the cap 400 is on an O-ring 126 made of nitrile, with a Shore A hardness of 75 and a tore diameter of 2.7 mm. The dimensions of the gorge 125 are defined by the values D=2.8 mm and G=3 mm.

When the cavity is under vacuum, the valve 131 may be closed.

Sealing of the Bead 500:

During step e), the sealing beads 500 are heated, preferably locally, in such a way as to be vitrified and welded, in order to ensure the mechanical cohesion and leak tightness of the encapsulation. The laser weld is formed through the cap 400.

Advantageously, the sealing beads 500 are heated locally with a laser radiation. The laser radiation is represented by the arrows L in FIG. 5D. In such a way as to localise further the laser radiation, a fibre laser is advantageously chosen.

Heating by laser irradiation is particularly advantageous since it does not require heating the whole of the substrate 200 and the cap 400. It makes it possible to heat locally the beads 500 to a temperature greater than or equal to the melting temperature of the fusible material forming the beads 500. For example, the beads 500 are heated locally to more than 500° C., preferably to at least to 600° C., for example 600° C. to 700° C., in such a way as to vitrify them and to form welds, required for the sealing. The cap 400 is thereby sealed in a permanent manner to the substrate 200 containing the components 300.

The increase in temperature makes the materials of the beads 500 more easily deformable by fusion effect, and increases the contact surface between the bead 500 and the cap 400 or the substrate 200. The temperature can reach, locally, more than 600° C. during laser irradiation.

The main characteristics of the lasers will be chosen by those skilled in the art as a function of the nature of the glass paste employed for the bead 500 and the optical properties of the cap 400. More particularly, the range of laser wavelengths available goes from the infrared ($CO_2$, Nd:YAG lasers, etc.) to ultraviolet light (Excimer laser and Nd harmonics: YAG laser). This offers the possibility of selecting the most suitable wavelength to guarantee efficient bonding of the glass pastes. For example, a radiation at a wavelength lying in the domain of the near infrared, typically 940 nm, may be selected.

The bead 500 may be subjected to a laser illumination for a duration ranging from several tens of seconds to several hundreds of seconds.

The sealing may be carried out by laser scanning. The beam is displaced at a speed of several mm/s, for example of the order of 2 mm/s. For example, a laser illumination at a power of 80 W for 60 s, with a displacement of 2 mm/s is sufficient to lead to the abrasion of the bead 500.

The attachment of the cap 400 to the substrate 200 is realised, on the one hand thanks to the placing under vacuum, which makes it possible to exert a pressure on the sealing beads 500 with the cap 400, and on the other hand thanks to the localised heating. A sealing interface is created between the two surfaces of the parts 200, 400 to assemble.

The compression of the cap 400 provides a mechanical assistance by exerting a localised force, at the level of the sealing beads 500, during the laser sealing.

This bearing force makes it possible to pin the cap 400 against the sealing beads 500, which increases the contact surface between the bead 500 and the substrate 200.

Figure 5E:
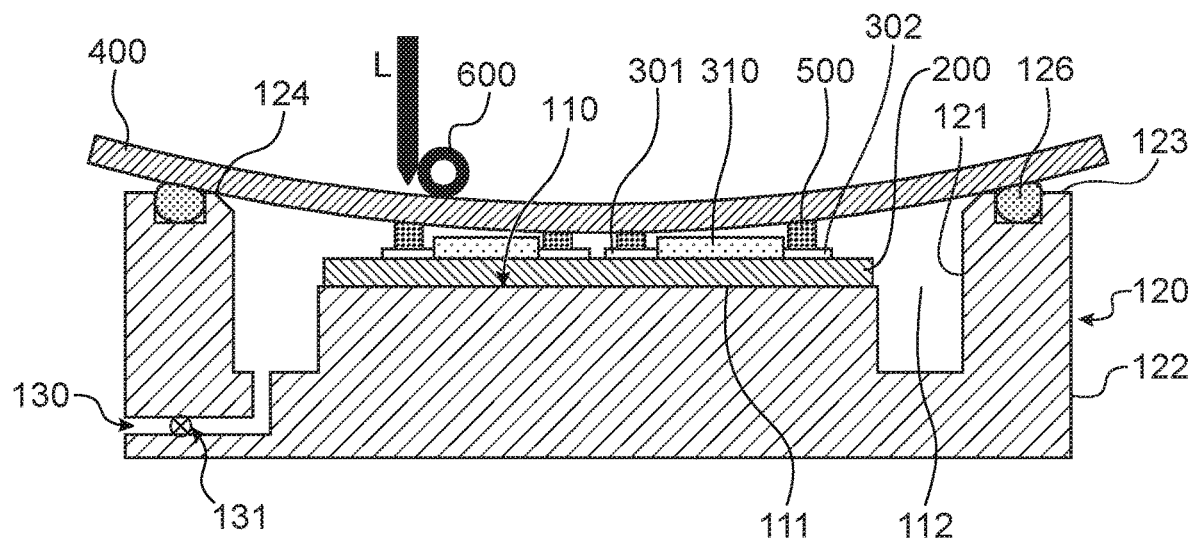

According to an alternative, as represented in FIG. 5E, the compression may be assisted by a mechanical force external to the sealing cell 100. For example, a mechanical stylet equipped with a suitable laser source (arrow L) and a mechanical bearing roller 600 may be used. The mechanical roller 600 exerts an additional pressure at the moment of the melting of the sealing bead 500 by laser irradiation.

Figure 5F:
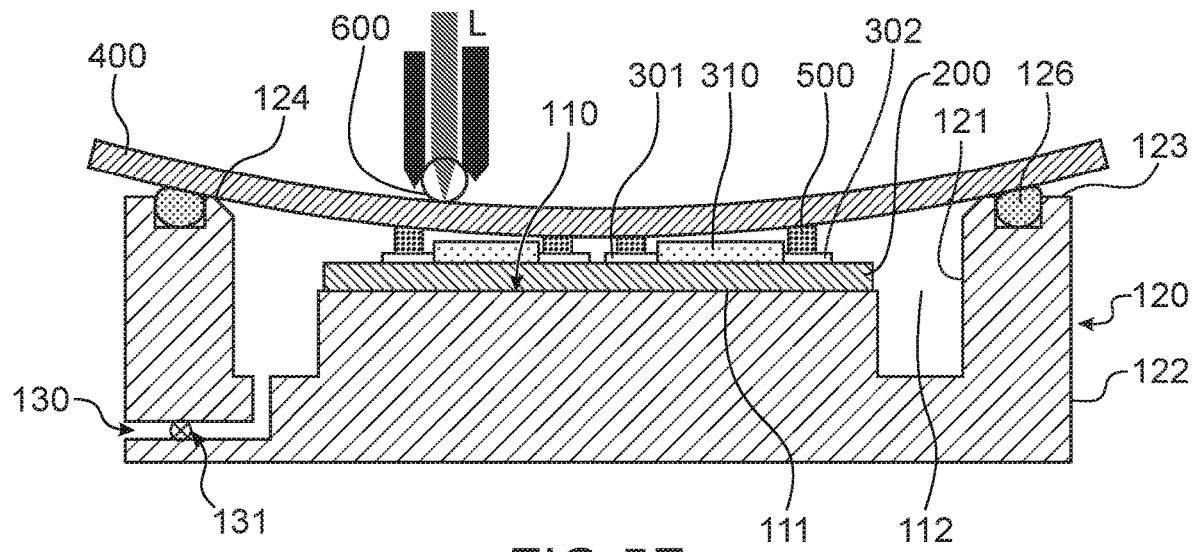

According to another alternative, represented in FIG. 5F, the mechanical stylet is equipped with a laser source (arrow L) and a means for focusing the beam. Advantageously, the bearing roller 600 has both a role of concentration lens and ad hoc mechanical bearing force.

Figure 1:
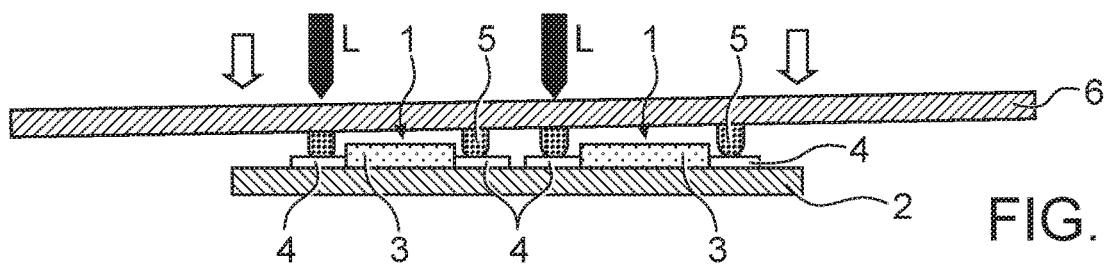
FIG. 1, already described, is a schematic representation of a step of a method for encapsulating two microbatteries, arranged on a substrate, according to the prior art.
Figure 5G:
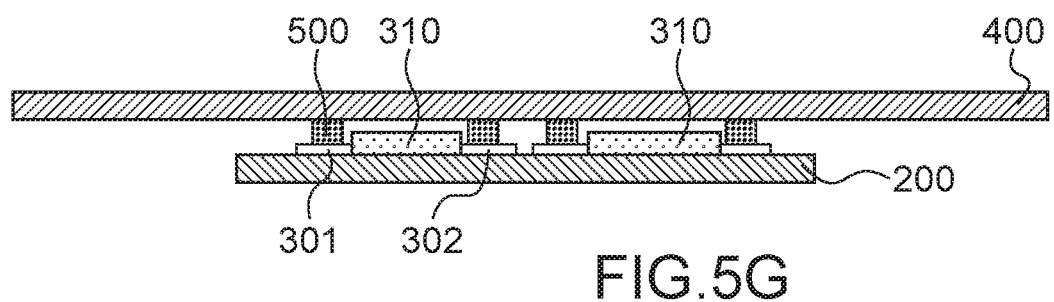

Unlike methods of the prior art, the sealing beads 500 produced according to the invention are completely welded (there are no problems linked to the flatness of the substrate) and the welds obtained are more robust and more leak tight (FIG. 5G) than those of the prior art (FIG. 1).

The method is, advantageously, carried out in an inert environment, in such a way as to fill the cavities, delimited by the substrate 200, the cap 400 and the sealing bead 500, with an inert gas. Getters may also be used to trap oxygen and water vapour. The method is, for example, carried out in a glove box.

After the different steps of the encapsulation method, the cavity of the sealing cell 100 is returned to ambient pressure via the opening 130 and the valve 131. The cap 400, which has a surface greater than that of the substrate 200, may be cut. The different microelectronic components 300, each protected individually, may be separated from each other.

The method of the present invention makes it possible to encapsulate in a simultaneous grouped manner several microelectronic components arranged on a same substrate or on several substrates and, more particularly, components produced on ultrathin substrates with ultrathin caps.

The invention claimed is:

1. A method for encapsulating a microelectronic component arranged on a substrate including at least the following successive steps:

a) supplying a sealing cell comprising: a bottom with a receiving zone for the substrate and a peripheral zone surrounding the receiving zone, a side wall formed of an internal face, an external face and an upper face, the upper face being configured to support a cap facing the receiving zone, an opening, arranged in the bottom of the cell, in the side wall, or in the cap, the opening being configured to be connected to a pumping system, in such a way as to be able to place under controlled atmosphere a cavity delimited by the side wall, the bottom and the cap, b) depositing a sealing bead, on the substrate and/or on the face of the cap intended to be facing the substrate, c) positioning the substrate provided with the microelectronic component to encapsulate on the receiving zone of the sealing cell, and positioning the cap on the upper face of the sealing cell, the cap being based on a material based on glass or the family of glasses, or silicon or ceramic and having a Young's modulus greater than 20 GPa and less than or equal to 100 GPa, d) placing under controlled atmosphere the cavity formed by the cap and the sealing cell, via the opening, in such a way as to make the cap bend towards the substrate, until the sealing bead is placed in contact both with the substrate and with the cap, e) localised heating of the sealing bead, in such a way as to seal the cap to the substrate.

2. The method according to claim 1, the cap being based on a material having a first thermal expansion coefficient, the substrate being based on a material having a second thermal expansion coefficient which varies by at the most 10% compared to that of the first thermal expansion coefficient.

3. The method according to claim 1, the sealing bead being a fusible material selected, notably, from a glass paste, and a metal material.

4. The method according to claim 1, the sealing bead being heated by laser irradiation, through the cap, the cap being transparent to the laser wavelength.

5. The method according to claim 1, during step d) and/or step e), a mechanical force being exerted on the cap to accentuate the bending of the cap towards the substrate.

6. The method according to claim 5, the mechanical force being produced with a mechanical stylet.

7. The method according to claim 6, the mechanical stylet being equipped with a laser source with, in particular, a means for focusing said laser beam.

8. The method according to claim 1, wherein the values of the thermal expansion coefficients of the cap, the substrate and the sealing bead vary by at most 10% from each other or in which the cap and/or the substrate and/or the sealing bead are made of glass.

9. The method according to claim 1, wherein a sealing material is arranged at step b) on the face of the cap intended to be facing the substrate.

10. A device for encapsulating a micro-component such as a microelectronic component, arranged on a substrate, with a cap, including:

a sealing cell comprising a bottom having a receiving zone for the substrate and a peripheral zone surrounding the receiving zone, a side wall formed of an internal face, an external face and an upper face, the upper face being configured to support the cap facing the receiving zone, an opening, arranged in the bottom of the cell, in the side wall, or in the cap, the opening being configured to be connected to a pumping system, in such a way as to be able to place under controlled atmosphere a cavity delimited by the side wall, the bottom and the cap, the cap intended to be transferred onto the substrate, the cap being positioned on the upper face of the sealing cell, the cap being made of a material based on glass or the family of glasses, or silicon or ceramic, and having a Young's modulus greater than 20 GPa and less than or equal to 100 GPa, and a sealing bead, on the substrate and/or on the face of the cap intended to be facing the substrate, wherein the sealing bead seals the cap to the substrate.

11. The device according to claim 10, wherein the cap has a thermal expansion coefficient which varies by at the most 10% from that of the substrate.

12. The device according to claim 10, wherein the values of the thermal expansion coefficients of the cap, the substrate and the sealing bead vary by at the most 10% from each other.

13. The device according to claim 10, wherein the sealing cell includes a bevelled edge arranged between the upper face and the internal face of the side wall or in which the sealing cell includes a receiving zone with a hollowing out, in such a way as to form a housing for the substrate.

14. The device according to claim 10, in which the microcomponent is an electrochemical device and, notably, a solid micro-battery, in particular a lithium micro-battery.

* * * * *